(12) United States Patent
Desplats et al.

(10) Patent No.: US 6,844,625 B2
(45) Date of Patent: Jan. 18, 2005

(54) METHOD FOR PRODUCING INPUT/OUTPUT PERMUTATION OF SEVERAL CONDUCTIVE STRIPS WITH PARALLEL BRANCHES OF AN INTEGRATED CIRCUIT AND RESULTING CIRCUIT

(75) Inventors: Romain Desplats, Toulouse (FR); Bruno Benteo, Pompertuzat (FR)

(73) Assignee: Centre National d'Etudes Spatiales (C.N.E.S.), Paris Cedex (FR)

( * ) Notice: Subject to any disclaimer, the term of this patent is extended or adjusted under 35 U.S.C. 154(b) by 114 days.

(21) Appl. No.: 10/297,467
(22) PCT Filed: Jun. 6, 2001
(86) PCT No.: PCT/FR01/01737

§ 371 (c)(1),
(2), (4) Date: Dec. 6, 2002

(87) PCT Pub. No.: WO01/95394

PCT Pub. Date: Dec. 13, 2001

(65) Prior Publication Data

US 2004/0022019 A1 Feb. 5, 2004

(30) Foreign Application Priority Data

Jun. 9, 2000 (FR) .......................................... 00/07400

(51) Int. Cl.[7] .............................................. H01L 23/48
(52) U.S. Cl. ...................... 257/734; 257/48; 257/203; 257/758; 257/773
(58) Field of Search ...................... 257/734, 48, 203, 257/208, 211, 758, 773

(56) References Cited

U.S. PATENT DOCUMENTS 4,652,974 A    3/1987   Ryan
4,974,048 A   11/1990   Chakravorty et al.
5,192,222 A    3/1993   Krause et al.
5,815,374 A    9/1998   Howell
2004/0022019 A1 *  2/2004   Desplats et al. ............ 361/683

OTHER PUBLICATIONS

P Hoffman et al., "Direct Writing of Gold Nanostructutes Using a Gold–Cluster Compound and a Focused–Ion Beam", Journal of Applied Physics, US, American Institute of Physics. New York, vol. 74, No. 12, Dec. 15, 1993 pp. 7588–7591, XP000423034 ISSN: 0021–8979 le document en entier.

R. Rajapakse et al., "Focused Ion Beam Repair for Thick Film Multilayer Wafer Scale Interconnections", Proceedings of the International VLSI Multilevel Interconnection Conference, US, New York, IEEE, vol. Conf. 3, Jun. 9, 1986, pp. 362–371, XP000010175 pp. 366, alinea 2 p. 367, alinea 1.

* cited by examiner

*Primary Examiner*—Mark V. Prenty
(74) *Attorney, Agent, or Firm*—Young & Thompson

(57) ABSTRACT

A method for producing an input/output permutation of several conductive strips on an integrated circuit consists in: identifying, among the parallel branches of the conductive strips, a minimal group whereof the branches are designed to be subjected to input/output swapping; locating a bend (3) on a deflected branch (2) and carrying out a conductive deposit (5) perpendicular from said bend (3) between the two parallel branches (1, 2), and an inclined deposit (9) between the perpendicular branch (4) and the parallel branch (1) with breaks (7, 8) so as to swap the inputs and the outputs. The invention also concerns the resulting integrated circuit.

14 Claims, 6 Drawing Sheets

Figure 1:
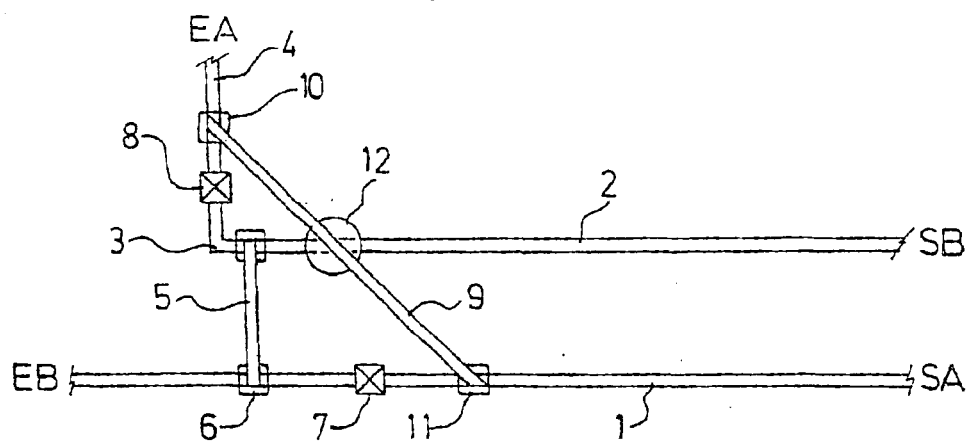

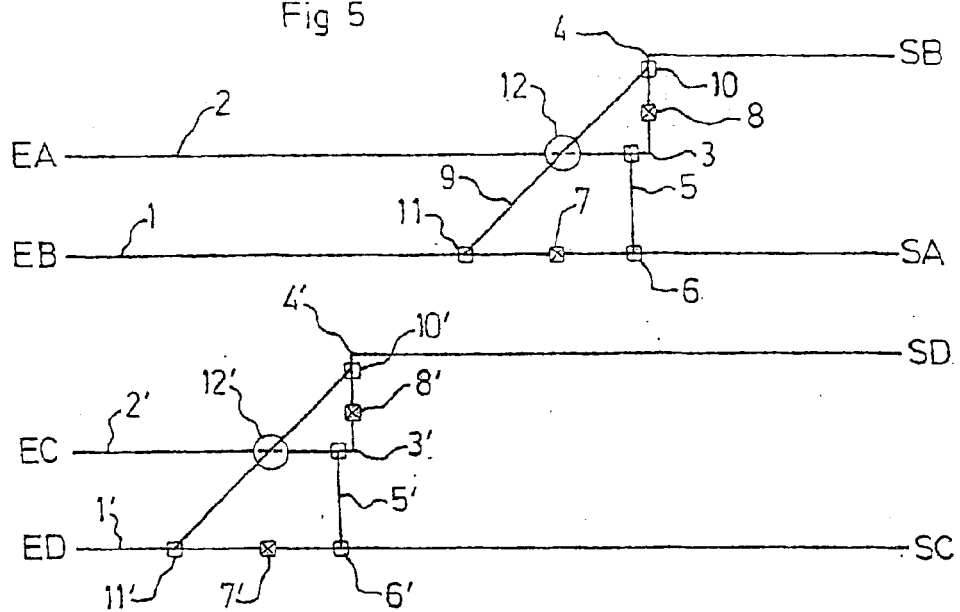
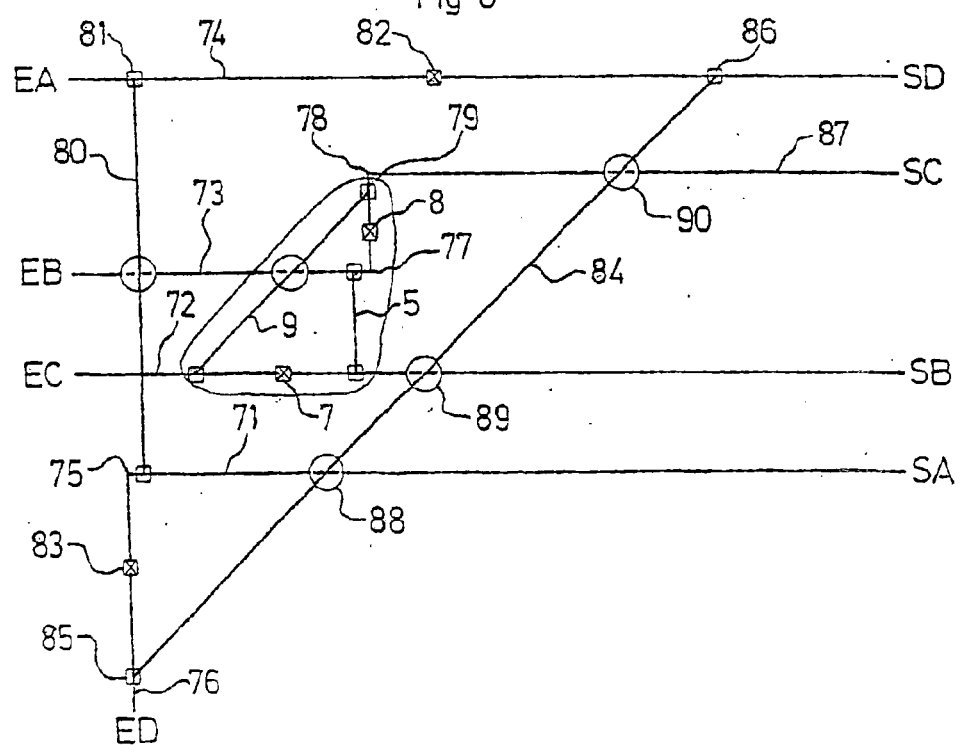

METHOD FOR PRODUCING INPUT/OUTPUT PERMUTATION OF SEVERAL CONDUCTIVE STRIPS WITH PARALLEL BRANCHES OF AN INTEGRATED CIRCUIT AND RESULTING CIRCUIT

The invention concerns a method for producing, on an integrated circuit after manufacture, an input/output permutation of multiple tracks of conductive material of the integrated circuit, comprising the branches, which are parallel to each other, by a combination of operations to break tracks and to deposit conductive material, and if appropriate insulating material. It also concerns an integrated circuit which can be obtained by such a method.

In operations to correct integrated circuits after manufacture, in particular to correct certain faults in them, it is often necessary to produce an input/output permutation of multiple tracks. For example, the input of a first track must be connected to the output of a second track, and insulated from its original output, which itself must be connected to the input of the second track, the inputs and outputs being swapped. More generally, an input/output permutation must sometimes be produced on a number of tracks which may be equal to two or greater than two. The permutations to be produced can be of various kinds, circular or not, and incorporate one or more swaps.

Throughout the text, the term "swap" designates any permutation of an initial set of elements into a permutated set of these elements by which each element of the permutated set has been permutated in relation to the elements of the initial set, and which cannot be split into subpermutations (i.e. permutations which concern a subset of the initial set) or restricted to a subpermutation. A swap is thus a minimal, circular or noncircular permutation which changes the sequence of all the elements of the initial set.

Similarly, throughout the text, the expression "input/output permutation of tracks" designates an operation consisting of permutating the inputs of a group of tracks in relation to their initial inputs, and/or the outputs of a group of tracks in relation to their initial outputs. Traditionally, the inputs and outputs, as well as the terms "downstream" and "upstream", are defined in relation to the direction of propagation of the signal in the tracks. Similarly, the term "horizontal" refers to any direction which is parallel to the layers of material of the integrated circuit, and the term "vertical" refers to any direction which is orthogonal to these layers, the substrate of the integrated circuit being assumed to be at the bottom.

The situation which is most often encountered when an input/output permutation of multiple tracks has to be carried out is that the tracks have branches which are parallel to each other, in general belonging to the same layer of conductive material (metal layer), or sometimes to distinct layers. In fact, the set of tracks of which the inputs/outputs must be permutated often represents a bus, i.e. it carries the signals in parallel. In fact, it happens that design errors are made to implement such buses.

For example, at the time of a correction after manufacture on an integrated circuit, using a focused ion beam (FIB) facility, one or more break(s) in track(s) are made, and one or more deposit(s) of conductive material are made to connect two tracks to each other, and if necessary, one or more deposit(s) of insulating material are made, so that subsequently a deposit of conductive material can be made above a bare track without making an electrical connection to that track.

At the time of such an intervention, it is right to carry out the minimum possible number of operations, and to choose the simplest and least expensive options. In particular, it is advantageous to make rectilinear deposits (without bends in a single straight segment or with the minimum number of bends) which are as short and as few as possible. Additionally, it is advantageous to avoid the successive conductive deposits crossing, necessitating the addition of an insulating deposit between them.

Additionally, to make the corrections faster, there is a requirement to have effective, systematic methods for the commonest situations, with a view, in particular, to obtaining corrected integrated circuits of improved reliability and quality.

The invention therefore aims at an economical, rapid and systematic method which makes it possible, on an integrated circuit after manufacture, to permutate inputs/outputs of multiple tracks with parallel branches (at the same metal level, or not, within the integrated circuit).

More particularly, the invention aims at proposing a method in which the deposits are few in number, as short as possible, with a minimum number of bends in the conductive deposits—in particular with one bend at most, and preferably none—and in which the number of insulating deposits is minimized, and all insulating deposits between two successive conductive deposits are avoided.

The invention also aims at proposing an integrated circuit of improved reliability and quality, which has been subjected to at least one input/output permutation of multiple tracks with parallel branches.

To do this, the invention proposes a method of the above-mentioned kind, wherein:

among the parallel branches, at least one minimal group of parallel branches belonging to the tracks of which the inputs/outputs must, in the permutation, be subjected to a swap in relation to the outputs/inputs of the tracks to which the parallel branches of this minimal group belong is identified, it not being possible to find a subgroup of parallel branches in this minimal group, belonging to tracks of which the inputs/outputs must, in the permutation, be subjected to a swap in relation to the outputs/inputs of the tracks to which the parallel branches of this subgroup belong, along the parallel branches of the minimal group, a bend where one of them, called the deflected branch, is deflected by a right angle in relation to the parallel branches of the minimal group is located, this being prolonged from the bend by a branch, called the perpendicular branch, which is perpendicular to this deflected branch, the deflected branch and the perpendicular branch belonging to the same layer of conductive material of the integrated circuit, to produce the said swap of the inputs/outputs of the tracks corresponding to the parallel branches of the minimal group, depositing and breaking operations are carried out at least adjacent to the located bend, comprising:

a rectilinear deposit, called the perpendicular deposit, of conductive material, perpendicular to the parallel branches between the deflected branch immediately adjacent to the bend, and a parallel branch which must be connected to this deflected branch to produce the swap, a deposit, called the inclined deposit, of conductive material between a point, called the first connection point, of the perpendicular branch and a point, called the second connection point, of a parallel branch which must be connected to this perpendicular branch to produce the swap, this inclined deposit passing above at least the deflected branch, and being insulated from it, and from any other intermediate track above which this inclined deposit must pass between the connection points, by a layer of insulating material, a break of the perpendicular branch between the said first connection point and the bend, a break immediately adjacent to the second connection point on a portion of the parallel branch including this second connection point, adjacent to the inclined deposit, and forming an acute angle with the straight direction passing through the connection points of this inclined deposit, this swap is repeated for each identified minimal group of parallel branches, so as to obtain the permutation of inputs/outputs of all the tracks.

The invention thus starts from the observation according to which, in any integrated circuit, when multiple initial parallel branches have to be swapped (crossed), at least one of the branches—in particular the one which is furthest out according to the horizontal direction when these branches are at the same level—always has a bend where it is deflected from this group of parallel branches. In fact, it is certain that an integrated circuit has no tracks which are always quite parallel, without deflection, from one side to the other of the integrated circuit.

Advantageously and according to the invention, given that the parallel branches all belong to the same layer of conductive material, the deflected branch is the furthest out in this layer in relation to the parallel branches of the minimal group, and is deflected by a right angle towards the outside of these parallel branches, the perpendicular branch extending within this layer from the bend to the outside of the parallel branches of the minimal group.

The invention can nevertheless also be applied if the parallel branches belong to different levels (different layers). In this case, within the same layer containing the deflected branch, if there are multiple parallel branches, the perpendicular branch extends to the outside of the parallel branches and the deflected branch is the furthest out of the parallel branches of the same layer.

The method of the invention also applies whether the parallel branches of the same layer are adjacent (with no tracks between them) or not adjacent.

Additionally, according to a preferred characteristic of the invention, the most upstream bend in relation to the direction of propagation of the signal in the parallel branches is located, and depositing and breaking operations are carried out at least adjacent to this bend. This being so, the perpendicular branch can prolong the deflected branch either upstream or downstream in relation to the direction of propagation of the signal.

The invention is applied particularly advantageously in the case of a passivated integrated circuit including an upper insulating layer.

Advantageously and according to the invention, deposits of conductive material are made above the said upper insulating layer of the integrated circuit after making, at least through this layer, connecting holes baring the portions of tracks to be connected.

Additionally, advantageously and according to the invention, two parallel branches, both distinct from the deflected branch, are connected by a perpendicular deposit, i.e. a rectilinear deposit of conductive material, perpendicular to these parallel branches, and a break is made upstream from this perpendicular deposit on one of these parallel branches and downstream from this perpendicular deposit on the other of these parallel branches.

According to a preferred characteristic of the invention, the method is one wherein:

the perpendicular deposit(s) are made first, beginning with the one which is connected to the deviated branch, and if appropriate step by step from this perpendicular deposit on each pair of adjoining parallel branches, the inclined deposit is made next, then the breaks are made.

The said parallel branches are adjoining in the sense that there are no other parallel branches belonging to the said minimal group between them.

Additionally, advantageously and according to the invention, at least one inclined deposit is formed of a single rectilinear segment which is inclined in relation to the direction of the parallel branches.

As a variant, at least one inclined deposit is formed of two rectilinear segments, one of which is perpendicular to the direction of the parallel branches.

The second segment can be inclined or parallel to the direction of the parallel branches.

In the case in which the permutation must affect only two tracks, it consists simply of implementing a crossing of two parallel branches which form the said minimal group. As a variant, the permutation can also consist of multiple swaps (crossings) of pairs of parallel branches. Each pair of parallel branches to be crossed is a minimal group. In another variant, it can also consist of a swap, circular or not, on more than two parallel branches forming a minimal group, or include one or more such swaps. All combinations of these variants are conceivable.

Advantageously and according to the invention, depositing and breaking operations are carried out using at least one focused ion beam (FIB) facility.

The invention extends to an integrated circuit which is obtained after correction by a method according to the invention. The invention thus also concerns an integrated circuit comprising parallel branches, called branches, which are parallel to each other and belong to tracks of conductive material, of which at least one, called the deflected branch, has at least one bend where it is deflected by a right angle in relation to the parallel branches of a minimal group of parallel branches, being prolonged by a branch, called the perpendicular branch, which is perpendicular to this deflected branch, the right-angled bend being formed between this deflected branch and this perpendicular branch, the deflected branch and the perpendicular branch belonging to the same layer of material of the integrated circuit, wherein it comprises, at least adjacent to at least one bend of a deflected branch:

a rectilinear deposit, called the perpendicular deposit, of conductive material, perpendicular to the parallel branches between the deflected branch which is immediately adjacent to the bend, and a parallel branch which is thus connected to the deflected branch, a deposit, called the inclined deposit, of conductive material between a point, called the first connection point, of the perpendicular branch and a point, called the second connection point, of a parallel branch which is thus connected to this perpendicular branch, this inclined deposit passing above at least the deflected branch, and being insulated from it, and from any other intermediate track above which this inclined deposit must pass between the connection points, by a layer of insulating material, a break of the perpendicular branch between the said first connection point and the bend, a break immediately adjacent to the second connection point on a portion of the parallel branch including this second connection point, adjacent to the inclined deposit, and forming an acute angle with the straight direction passing through the connection points of this inclined deposit, in such a way that the inputs/outputs of the tracks which comprise these parallel branches have been subjected to a swap, by means of these deposits and breaks, in relation to the outputs/inputs of the said tracks.

Advantageously and according to the invention, the deposits are formed above an upper insulating circuit passivation layer, and are connected to the branches by connecting holes which pass through at least this upper insulating layer. Advantageously and according to the invention, the parallel branches belong to the same layer of material of the integrated circuit, the deflected branch is the furthest out in this layer in relation to the parallel branches of the minimal group, and it is deflected by a right angle towards the outside of these parallel branches, the perpendicular branch extending within this layer from the bend to the outside of the parallel branches of the minimal group.

The invention also concerns a method and an integrated circuit wherein all or some of the characteristics which are mentioned above or below are combined.

Figure 2:
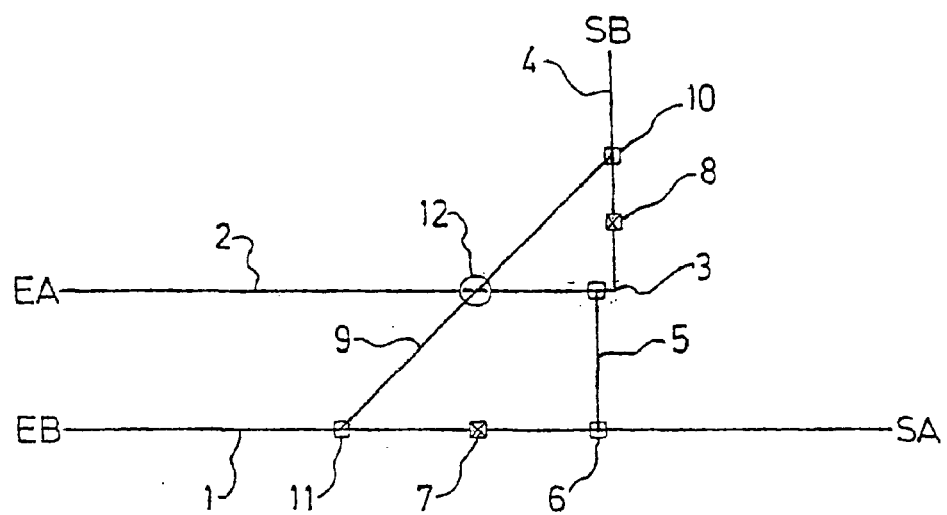
Figure 3:
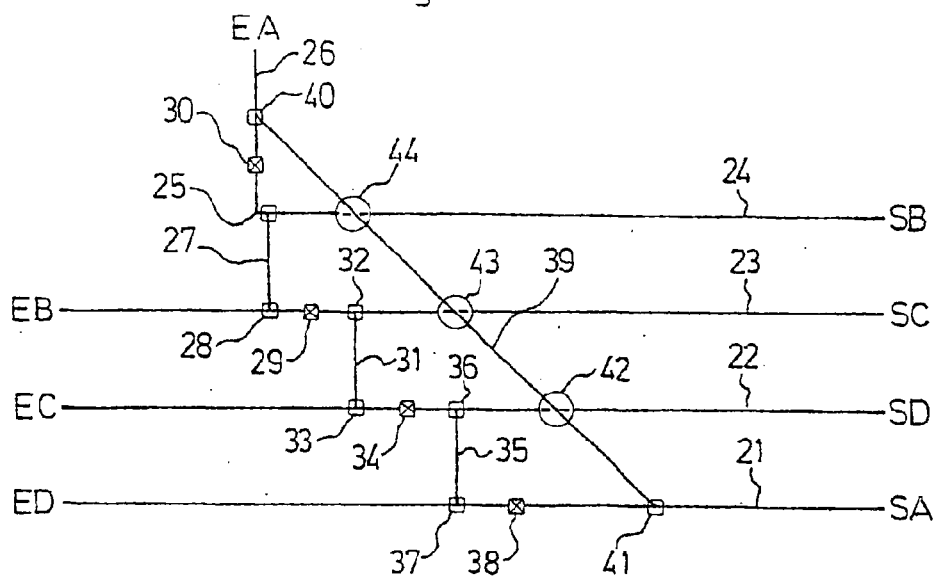
Figure 4:
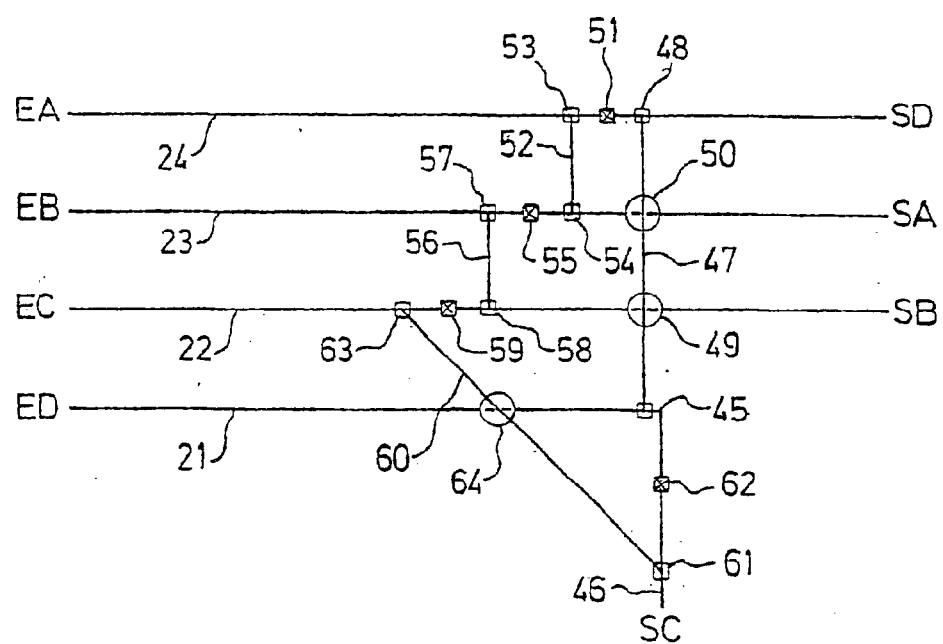
Figure 7:
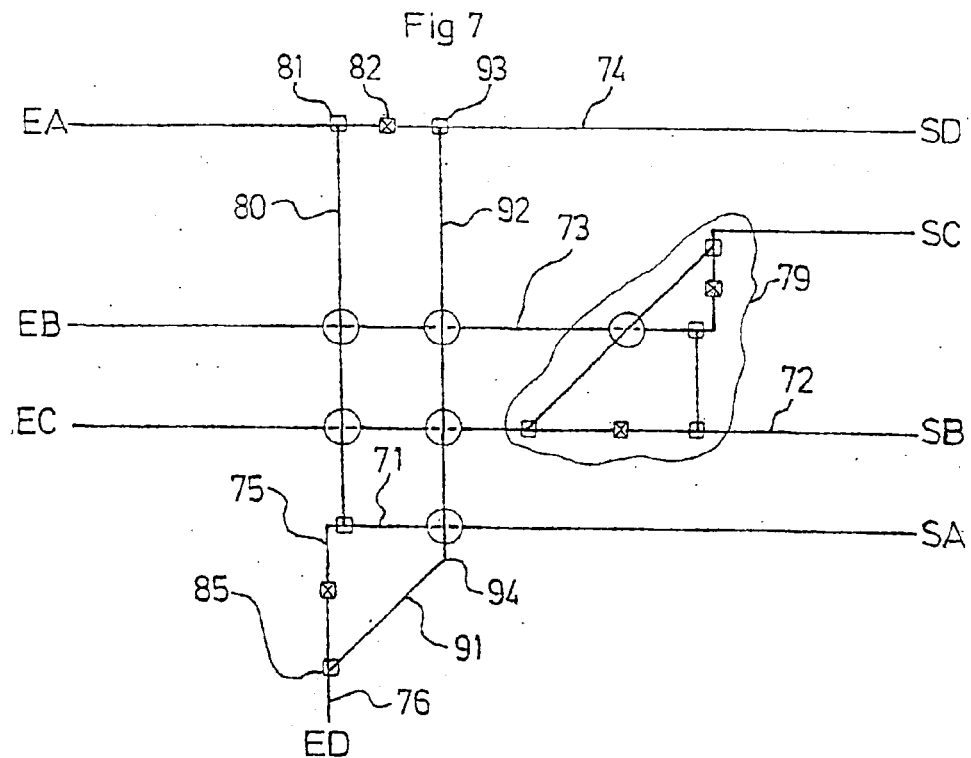
Figure 8:
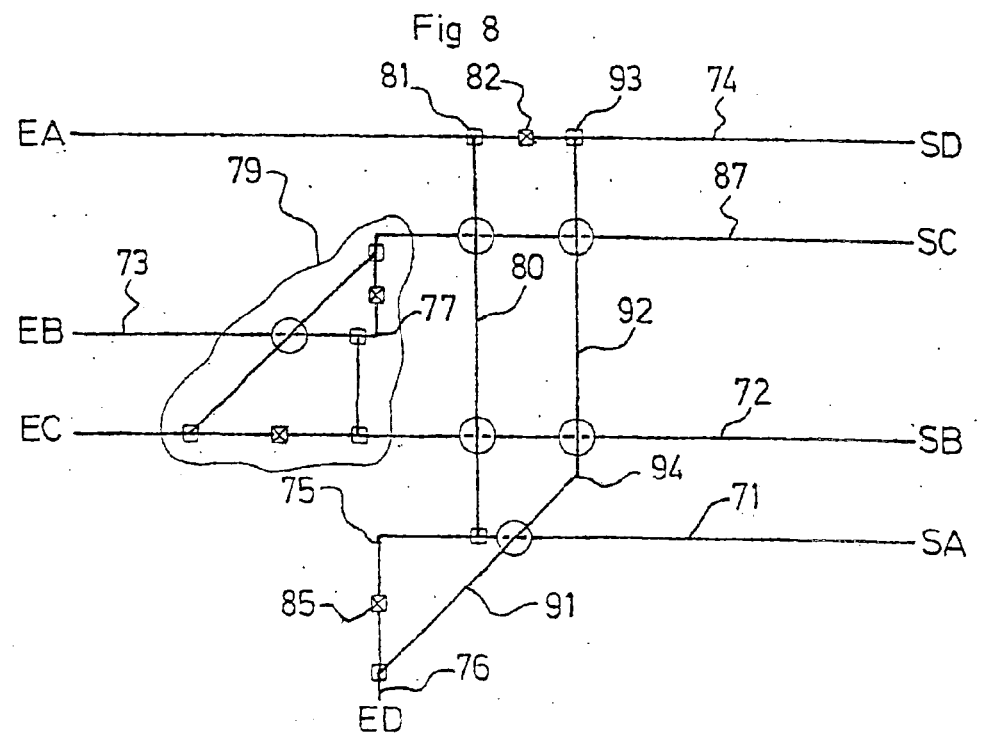
Figure 9:
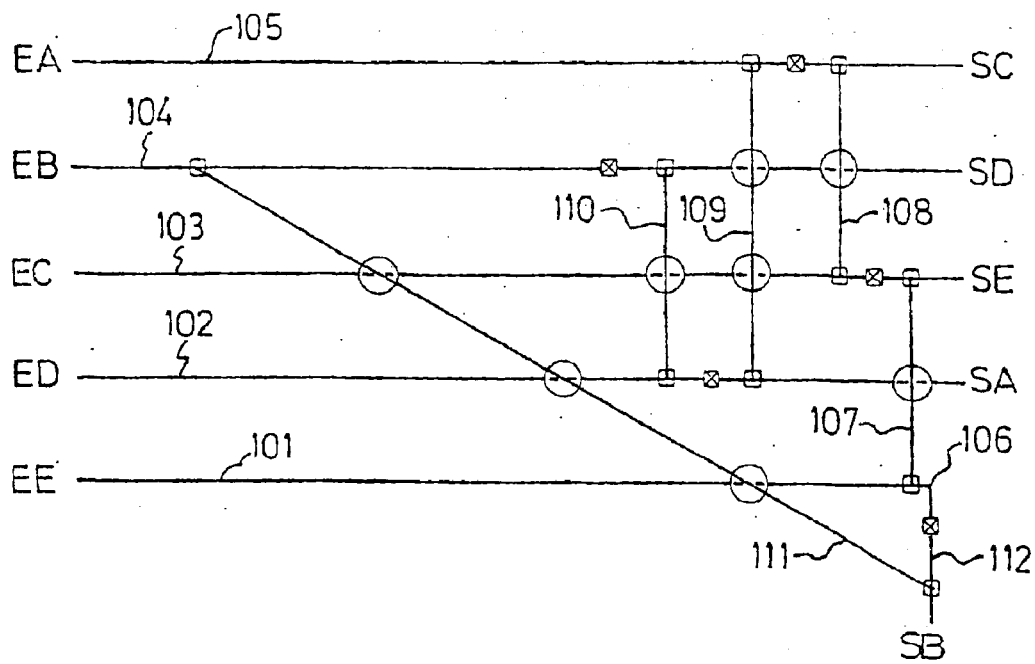
Figure 10:
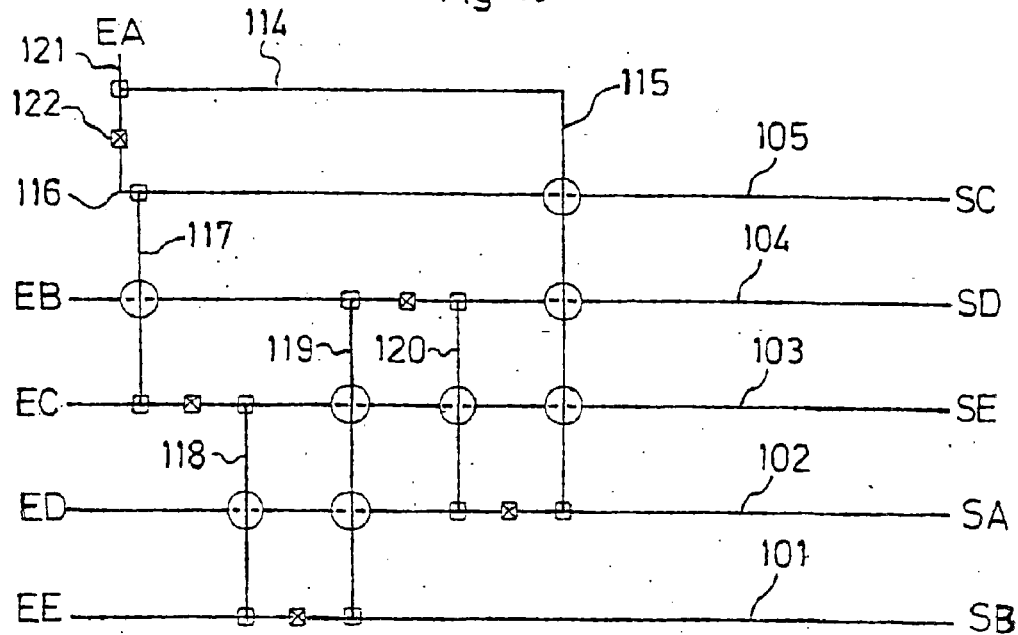
Figure 11:
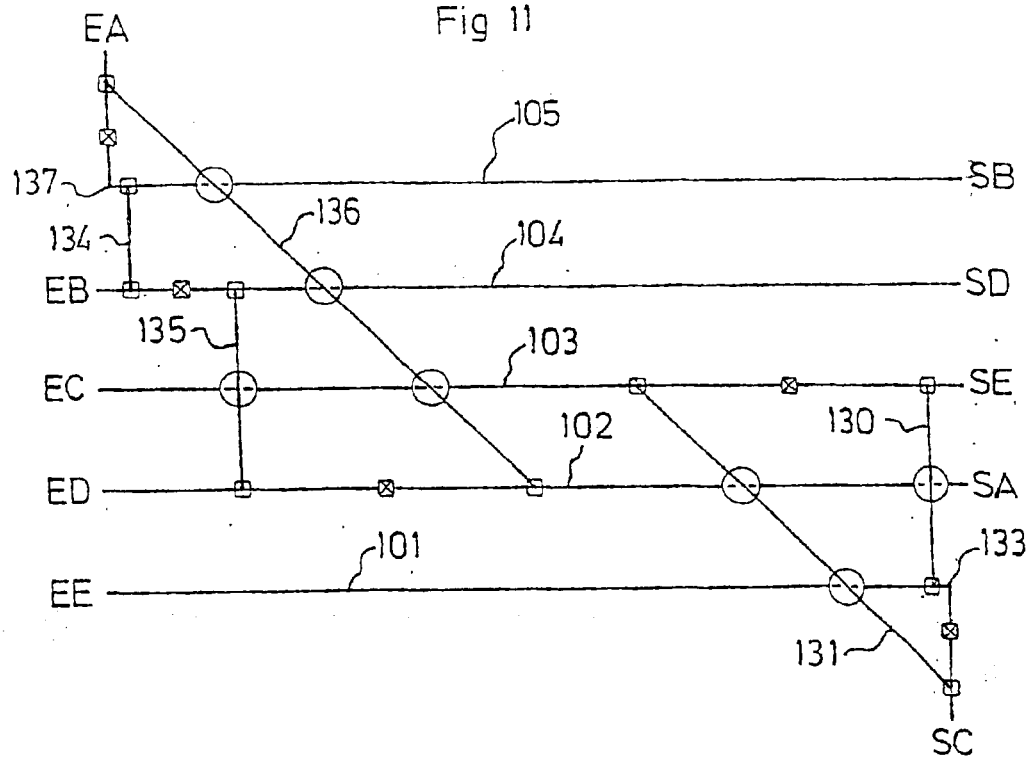
Figure 12:
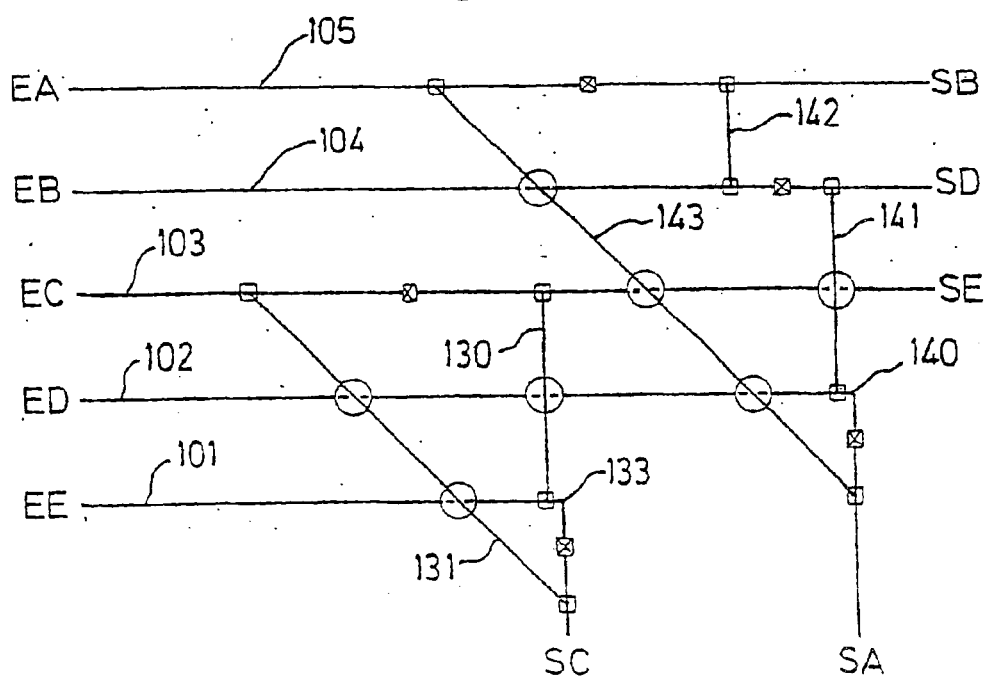

Other purposes, characteristics and advantages of the invention appear in the following description of implementation examples, which refer to the attached figures:

FIG. 1 is a diagram which illustrates a method and a circuit according to the invention, for swapping the inputs/outputs of two tracks with adjacent parallel branches, the perpendicular branch being upstream from the deflected branch, FIG. 2 is a diagram which illustrates a variant of FIG. 1, in which the perpendicular branch is downstream from the deflected branch, FIG. 3 is a diagram which illustrates a method and a circuit according to the invention in an example of circular permutation on four tracks, FIG. 4 is a diagram which illustrates a method and a circuit according to the invention in another example of circular permutation on four tracks, FIG. 5 is a diagram which illustrates a method and a circuit according to the invention in an example of permutation on four tracks with two juxtaposed swaps, FIG. 6 is a diagram which illustrates a method and a circuit according to the invention in an example of permutation on four tracks with two interleaved swaps, FIGS. 7 and 8 are diagrams which respectively illustrate two variants of FIG. 6, FIGS. 9 and 10 are diagrams which respectively illustrate two variants of a method according to the invention for a circular permutation of inputs/outputs on a minimal group of five tracks, FIGS. 11 and 12 are diagrams which respectively illustrate two variants of a method according to the invention for a non-circular permutation of inputs/outputs on a group of five parallel branches, corresponding to two circular swaps on minimal groups of two and three parallel branches.

On the figures, a portion of an integrated circuit diagram has been represented. This representation is done in the traditional way, seen from the side of the upper face, the various tracks being assumed to be placed at the same metal level (same layer of conductive material). However, as part of the invention, this condition is not at all necessary, and the various tracks can belong to different metal levels. In fact, all that is necessary in this case is to provide connecting holes of appropriate depth to reach each of the tracks to be connected. On FIGS. 2 to 12, the representation of tracks has been simplified (simple lines) compared to that of FIG. 1, where the breadth of the tracks is represented.

On the figures, the state of the diagram after correction has been shown, i.e. after having implemented the method according to the invention. The integrated circuit comprises branches which are parallel to each other. Each branch belongs to a track, and has one signal input EA, EB, EC, ED, EE and one signal output SA, SB, SC, SD, SE. In general, all the inputs are placed on the same side of the integrated circuit, and all the outputs are also placed on the same side. On the figures, it is assumed that the signal is propagated from left to right in the various parallel branches.

Throughout the following description which refers to the figures, the terms "upper" and "lower" are used in relation to the plane of the figures, not in relation to the vertical direction of the integrated circuit.

In the case of FIG. 1, the circuit comprises a lower rectilinear branch 1 and an upper rectilinear branch 2, which has, on its input side, a bend 3 from which it is prolonged by a perpendicular branch 4 which extends from the upper branch 2. Initially, the input of the perpendicular branch 4 is connected electrically to the output of the upper branch 2, and the input of the lower branch 1 is connected to the output of the lower branch 1. The invention makes it possible to swap the outputs and inputs of these branches. To do this, a rectilinear deposit of conductive material 5 is made, perpendicular to the two lower and upper branches 1, 2 and extending from the bend 3 of the upper branch 2 until it joins the lower branch 1 at a connection point 6. A break 7 is made downstream from the connection point 6 on the lower branch 1, and a break 8 is made upstream from the bend 3 on the perpendicular branch 4. An inclined deposit 9, which extends from a connection point 10 of the perpendicular branch 4 upstream from the break 8 to a connection point 11 of the lower branch 1 downstream from the break 7, is made. This inclined deposit 9 thus crosses the right angle which is formed by the bend 3 and passes above the upper branch 2, but is insulated from this upper branch 2 either by the upper passivation layer of the integrated circuit (in the case of a passivated circuit) or, if the upper branch 2 is bare, by a deposit of insulating material 12. As can be seen, the outputs SA and SB have thus been swapped in relation to the initial inputs EA and EB.

FIG. 2 shows a similar diagram in the case in which the bend 3 is situated on the side of the output of the upper branch 2, and the perpendicular branch 4 is connected on the side of the output of this upper branch 2. The perpendicular branch 4 thus extends downstream from the deflected branch 2. A perpendicular deposit 5 is again made between the bend 3 and a connection point 6 of the lower branch 1; a break 7 is made on the lower branch 1, which in this case is situated upstream from the connection point 6 of the perpendicular deposit 5; a break 8 is made on the perpendicular branch 4 downstream from the bend 3; and an inclined deposit 9 which extends between a connection point 10 on the perpendicular branch 4, which is situated downstream from the break 8, and a connection point 11 on the lower branch 1, which is situated upstream from the break 7. The input EB of the lower branch 1 is connected to the output SB of the perpendicular branch 4 via the inclined deposit 9, whereas the input EA of the upper branch 2 is connected to the output SA of the lower branch 1 via the perpendicular deposit 5. There too, if necessary, an insulating deposit 12 is placed between the upper branch 2 and the inclined deposit 9.

FIG. 3 shows an example of circular permutation which can be obtained with a minimal group of four parallel branches 21, 22, 23, 24. The upper parallel branch 24 has a bend 25 on its input side, and is prolonged from the bend 25 by a perpendicular branch 26 which extends upstream from the deflected branch 24. A perpendicular deposit of conductive material 27 is made between the bend 25 and the immediately adjacent parallel branch 23, which is adjacent to the deflected branch 24. The deposit 27 joins this track 23 at a connection point 28, downstream from which a break 29 is made. A break 30 is also made upstream from the bend 25 on the perpendicular branch 26. A perpendicular deposit of conductive material 31 is made between a connection point 32 downstream from the break 29 on the parallel branch 23, until it joins the parallel branch 22 which is immediately adjacent to this parallel branch 23, at a connection point 33, downstream from which a break 34 is made. In the same way, a conductive perpendicular deposit 35 is implemented between the parallel branch 22 and the lower parallel branch 21, between a connection point 36 on the parallel branch 22 and a connection point 37 on the lower parallel branch 21, downstream from which a break 38 is made. An inclined deposit 39 is made from a connection point 40 on the perpendicular branch 26 upstream from the break 30 of this perpendicular branch 26, to a connection point 41 of the lower parallel branch 21 downstream from its break 28. This inclined deposit 39 passes above the parallel branches 24, 23, 22, from which it is insulated by either the passivation layer or the insulating deposits 42, 43, 44 respectively. A single continuous insulating deposit can also be implemented above the various tracks 22, 23, 24, following the course of the inclined deposit 39. As can be seen, this method makes it possible to swap the outputs SA, SB, SC, SD according to a circular permutation, in relation to the inputs EA, EB, EC, ED of the various parallel branches 21, 22, 23, 24. Thus the input EA of the perpendicular branch 26 is connected via the inclined deposit 39 to the output SA of the lower parallel branch 21; the input EB of the parallel branch 23 is connected to the output SB of the upper parallel branch 24; the input EC of the parallel branch 22 is connected to the output SC of the parallel branch 23; and the input ED of the parallel branch 21 is connected to the output SD of the immediately higher parallel branch 22.

FIG. 4 shows another example of a situation of a minimal group of four parallel branches 21, 22, 23, 24. Nevertheless, in this example, it is the lower parallel branch 21 which deflected to the outside and forms a bend 45 with a perpendicular branch 46 which extends downstream from the deflected branch 21. Additionally, an example in which the deflected branch 21 must be connected to the parallel branch 24 which is the most distant of the group, whereas the perpendicular branch 46 must be connected to the parallel branch 22 which is immediately adjacent to the deflected branch 21, is shown. In this case, and contrary to the example of FIG. 3, a perpendicular deposit 47 which crosses the two intermediate parallel branches 22, 23 and thus connects the bend 45 to the upper parallel branch 24 at a connection point 48, is made. This perpendicular deposit 47 passes above the deposits 22, 23, from which it is insulated by either a passivation layer or insulating deposits 49, 50 respectively. There too, a single insulating deposit in the form of bands of large dimensions can be made, rather than two localised insulating deposits 49, 50. A break 51 is implemented upstream from the point 48 on the upper parallel branch 24, and a perpendicular deposit 52 connects this branch 24 from a connection point 53 upstream from the break 51 to a connection point 54 on the immediately lower parallel branch 23. A break 55 is made on this parallel branch 23 immediately upstream from the connection point 54. A deposit 56 connects a connection point 57 upstream from the break 55 of the parallel branch 23 to a connection point 58 on the immediately adjacent parallel branch 22. A break 59 is made upstream from the connection point 58 on the parallel branch 22. An inclined deposit 60 connects a connection point 61 of the perpendicular branch 46 downstream from a break 62, which is itself downstream from the bend 45, to a connection point 63 of the parallel branch 22 which is immediately adjacent to the parallel branch 21. The inclined deposit 60 is insulated from the deflected branch 21 by the passivation layer or by an insulating deposit 64. As can be seen, the outputs SA, SB, SC, SD are swapped according to a circular permutation in relation to the inputs EA, EB, EC, ED.

FIG. 5 illustrates the case of a permutation on four parallel branches 1', 2', 1, 2, which in fact is nothing but a duplication of the situation of FIG. 2. This permutation thus consists of two swaps, each swap being formed on a minimal group 1, 2 or 1', 2'. Thus, as in the case of FIG. 2, a perpendicular deposit 5, 5' is made between the bend 3, 3' and a connection point 6, 6' of the parallel branch 1, 1'; the breaks 7, 7' are made upstream from the connection points 6, 6' and 8, 8' and downstream from the bends 3, 3', on the perpendicular branches 4, 4'; and an inclined deposit 9, 9' is made between the connection points 10, 10' of the perpendicular branches 4, 4' and the connection points 11, 11' upstream from the breaks 7, 7' of the parallel branches 1, 1'. If appropriate, an insulating deposit 12, 12' is also provided between the inclined deposit 9, 9' and the deflected parallel branch 2, 2'. In this example, the two swaps are implemented separately on two pairs of parallel branches 1, 2 and 1', 2', which are adjacent.

In the variant of FIG. 6, the permutation is also formed of two swaps on two interleaved minimal groups of parallel branches. Thus two outer parallel branches 71, 74 must be swapped with each other, and two inner parallel branches 72, 73 must be swapped with each other. The outer parallel branch 71 has a bend 75, from which it is prolonged by a perpendicular branch 76 which extends upstream and towards the outside. The upper inner parallel branch 73 has a bend 77, from which it is prolonged towards the outside (in the direction of the upper outer parallel branch 74) and downstream by a perpendicular branch 78. For the minimal group which is formed by the two inner parallel branches 72, 73, the situation of FIG. 2 is recalled, and the perpendicular deposit 5, the inclined deposit 9 and the breaks 7, 8 are made as described above. When this is done, the set of these operations defines a zone 79 which is delimited schematically in FIG. 6, and which must be avoided to make the swap on the outer parallel branches 71, 74. In the case of FIG. 6, since the bend 75 is situated well upstream of this zone 79, it is possible to make a perpendicular deposit 80 directly between the bend 75 and a connection point 81 of the upper outer parallel branch 74. A break 82 is handled downstream from the point 81 on this parallel branch 74, and a break 83 is handled upstream from the bend 75 on the perpendicular branch 76. An inclined deposit 84 is made between a first connection point 85, upstream from the break 83 on the perpendicular branch 76, and a second connection point 86 on the upper outer parallel branch 74, downstream from the break 82. The inclined deposit 84 is situated downstream from the zone 79, whereas the perpendicular deposit 80 is situated upstream from the zone 79. In other words, in this example, the zone 79 in which the inner parallel branches 72, 73 are swapped is interleaved between the perpendicular deposit 80 and the inclined deposit 84, making it possible to swap the outer parallel branches 71, 74. The inclined deposit passes above the parallel branches 71, 72 and a prolongation 87 of the perpendicular branch 78, which extends parallel to the parallel branches. The inclined deposit 84 is insulated from these branches 71, 72, 87 by the passivation layer, or by insulating deposits 88, 89, 90 respectively.

FIG. 7 shows a similar example to the previous one, but in which the inclined deposit 84, which has a single segment, is replaced by an inclined deposit which is formed of two segments 91, 92, that is a segment 91 which is inclined in relation to the parallel branches 71, 72, 73, 74, prolonged by a second segment 92 which is perpendicular to the parallel branches 71, 72, 73, 74, and extending upstream from the zone 79 in which inner branches are swapped. The inclined deposit 91, 92 which is formed in this way thus consists of two rectilinear segments, that is an inclined segment 91 which extends from the first connection point 85 on the perpendicular branch 76 and a perpendicular segment 92 which extends between a second connection point 93 of the upper outer parallel branch 74 to join the inclined segment 91 at a connection point 94. It should nevertheless be noted that the break 82 on the parallel branch 74 which includes the second connection point 93 is made on the portion of the branch 74 which forms an acute angle with the (fictitious) straight line which passes through the first and second connection points 85, 93. This variant makes it possible to shorten the length of the inclined deposit which is thus formed in relation to that of FIG. 6.

FIG. 8 shows another variant, in which the bends 75, 77 are situated at least approximately in the same transverse zone. In this case, the perpendicular deposit 80 and the inclined deposit 91, 92 (or 84 as on FIG. 6) are shifted downstream of the zone 79 for swapping the inner parallel branches 71, 72.

FIG. 9 shows a general example of circular permutation on five branches 101, 102, 103, 104, 105, which form a minimal group. To swap the outputs SA, SB, SC, SD, SE in relation to the inputs EA, EB, EC, ED, EE, at the bend 106 of the deflected outer branch 101, the conductive deposit 107 is made as far as the parallel branch 103 which must be connected to the deflected branch 101, and then, bit by bit, each perpendicular conductive deposit 108, 109, 110 is made, after making the corresponding breaks. The inclined deposit 111 is made between the perpendicular branch 112 and the parallel branch 104 to which it must be connected. As can be seen, in all situations, it is possible to find a series of perpendicular deposits 107, 108, 109, 110 and an inclined deposit 111 of conductive material, which do not overlap each other. The set of these conductive deposits can thus be made above the passivation layer.

FIG. 10 shows another example of circular permutation, in which the inclined deposit 111 is replaced by two rectilinear segments 114, 115, one of which 114 is parallel to the parallel branches 101 to 105, whereas the other 115 is perpendicular to these parallel branches 101 to 105. There too, from the bend 116 of the deflected branch 105, conductive perpendicular deposits 117, 118, 119, 120 are made in succession, with corresponding breaks, followed by the inclined deposit 114, 115 from the perpendicular branch 121 (upstream from the break 122 which is made upstream from the bend 116).

The invention also applies to the case of a permutation which is formed from a non-circular swap, in the same way.

The invention also applies to the case of a permutation which consists of a combination of swaps, whether circular or not. In this case, the minimal groups on which swaps can be made are investigated, and for each minimal group which is found in this way, the swap is made by locating a bend on the outer branch of this minimal group, as described above.

FIGS. 11 and 12 show examples of non-circular permutation which consists of the combination of two circular swaps. For each swap, an inclined deposit is made. On FIG. 11, the two deflected branches are respectively the two outer parallel branches 101, 105. A swap is made between the parallel branches 101, 103 (first minimal group) using a perpendicular deposit 130 and an inclined deposit 131 at the bend 133 of the deflected branch 101. Additionally, a swap is made between the parallel branches 102, 104 and 105 (second minimal group) using two perpendicular deposits 134, 135 and an inclined deposit 136 at the bend 137 of the deflected parallel branch 105.

FIG. 12 shows the same permutation as FIG. 11, but in the case in which the bends are situated on the adjacent parallel branches 101, 102. The perpendicular deposit 130 is made from the bend 133 of the outer parallel branch 101, and also the corresponding inclined deposit as FIG. 11 describes. The branch 102 is deflected and has a bend 140, so two perpendicular deposits 141 and 142 and an inclined deposit 143 are made in relation to this bend 140, to obtain the second swap.

In a variant which is not represented, one or both of the inclined deposits 131, 143 can be formed of two rectilinear segments, as on FIGS. 7, 8 or 10.

As can be seen, the invention provides a systematic method which makes it possible to carry out this permutation, circular or not, between the outputs and inputs of a group of parallel branches. For each swap, circular or not, which is included in this permutation, a bend of one of the branches of the corresponding minimal group is used, and an inclined deposit is made from this bend as described above.

The various deposits which are made do not overlap each other, and all have a reduced length.

The invention can be the subject of very numerous variants, in relation to the only implementation examples which are represented and described above.

Each break and deposit can be made using a focused ion beam (FIB) facility, which is well known per se (e.g. of SCHLUMBERGER IDS P3X type).

Bends can be located by the human operator on the basis of a display of a representation of the tracks on the screen, which is managed by the IT system of the FIB facility. However, the bends can also be located automatically, e.g. using extracted polygons to represent the tracks as described by U.S. Pat. No. 5,192,222.

It should be noted that what is described above is the logical sequence in which the various operations to be carried out are determined. However, this logical sequence does not necessarily correspond to the sequence in which these various operations are carried out successively in practice and reality. In fact, it is preferable to carry out all the deposit operations in succession first, preferably beginning with the perpendicular conductive deposit from the bend, then all the perpendicular deposits in succession, finishing with the conductive inclined deposit, and then to carry out the track breaks. By making all the deposits before the breaks, making a conductive deposit inside a break is avoided.

What is claimed is:

1. A method for producing, on an integrated circuit after manufacture, an input/output permutation of multiple tracks of conductive material of the integrated circuit, comprising the branches, called parallel branches, which are parallel to each other, by a combination of operations to break tracks and to deposit conductive material and insulating material, wherein:

among the parallel branches (1, 2, 1', 2', 21 to 24, 71 to 74, 101 to 105), at least one minimal group (1, 2, or 1', 2', or 21 to 24, or 71 to 74, or 101, 103, or 102, 104, 105, or 101 to 105) of parallel branches belonging to the tracks of which the inputs/outputs must, in the permutation, be subjected to a swap in relation to the outputs/inputs of the tracks to which the parallel branches of this minimal group belong is identified, it not being possible to find a subgroup of parallel branches in this minimal group, belonging to tracks of which the inputs/outputs must, in the permutation, be subjected to a swap in relation to the outputs/inputs of the tracks to which the parallel branches of this subgroup belong, along the parallel branches of the minimal group, a bend (3, 3', 25, 45, 75, 77, 106, 116, 133, 137, 140) where one of them, called the deflected branch, is deflected by a right angle in relation to the parallel branches of the minimal group is located, this being prolonged from the bend by a branch, called the perpendicular branch (4, 4', 26, 46, 76, 112, 121), which is perpendicular to this deflected branch, the deflected branch and the perpendicular branch belonging to the same layer of conductive material of the integrated circuit, to produce the said swap of the inputs/outputs of the tracks corresponding to the parallel branches of the minimal group, depositing and breaking operations are carried out at least adjacent to the located bend, comprising:

a rectilinear deposit, called the perpendicular deposit (5, 5', 27, 47, 80, 107, 117, 130, 134, 141), of conductive material, perpendicular to the parallel branches between the deflected branch immediately adjacent to the bend, and a parallel branch which must be connected to this deflected branch to produce the swap, a deposit, called the inclined deposit (9, 9', 39, 60, 84, 91, 92, 111, 114, 115, 131, 136, 143), of conductive material between a point, called the first connection point, of the perpendicular branch and a point, called the second connection point, of a parallel branch which must be connected to this perpendicular branch to produce the swap, this inclined deposit passing above at least the deflected branch, and being insulated from it, and from any other intermediate track above which this inclined deposit must pass between the connection points, by a layer of insulating material, a break (8, 8', 30, 62, 83, 122) of the perpendicular branch between the said first connection point and the bend, a break (7, 7', 38, 59, 82) immediately adjacent to the second connection point on a portion of the parallel branch including this second connection point, adjacent to the inclined deposit, and forming an acute angle with the straight direction passing through the connection points of this inclined deposit, this swap is repeated for each identified minimal group of parallel branches, so as to obtain the permutation of inputs/outputs of all the tracks.

2. A method as claimed in claim 1, wherein given that the parallel branches (1, 2, 1', 2', 21 to 24, 71 to 74, 101 to 105) all belong to the same layer of conductive material, the deflected branch is the furthest out in this layer in relation to the parallel branches of the minimal group, and is deflected by a right angle towards the outside of these parallel branches, the perpendicular branch extending within this layer from the bend to the outside of the parallel branches of the minimal group.

3. A method as claimed in claim 1, wherein the most upstream bend (3, 3', 25, 45, 75, 77, 106, 116, 133, 137, 140) in relation to the direction of propagation of the signal in the parallel branches is located, and depositing and breaking operations are carried out at least adjacent to this bend.

4. A method as claimed in claim 1, in which the integrated circuit includes an upper insulating layer, wherein deposits of conductive material (5, 5', 27, 47, 80, 107, 117, 130, 134, 141, 9, 9', 39, 60, 84, 91, 92, 111, 114, 115, 131, 136, 143) are made above the upper insulating layer of the integrated circuit after making, at least through this layer, connecting holes baring the portions of tracks to be connected.

5. A method as claimed in claim 1, wherein two parallel branches (22, 23; 21, 22), both distinct from the deflected branch (24), are connected by a perpendicular deposit (31, 35) of rectilinear conductive material, perpendicular to these parallel branches, a break is made upstream from this perpendicular deposit on one of these parallel branches, and a break (34, 38) is made downstream from this perpendicular deposit on the other of these parallel branches.

6. A method as claimed in claim 1, wherein:
the perpendicular deposit(s) (5, 5', 27, 47, 80, 107, 117, 130, 134, 141) are made first, beginning with the one which is connected to the deviated branch, and if appropriate step by step from this perpendicular deposit on each pair of adjoining parallel branches,
the inclined deposit is made next (9, 9', 39, 60, 84, 91, 92, 111, 114, 115, 131, 136, 143),
then the breaks are made (8, 8', 30, 62, 83, 122, 7, 7', 38, 59, 82).

7. A method as claimed in claim 1, wherein at least one inclined deposit (9, 9', 39, 60, 84, 111, 131, 136, 143) is formed of a single rectilinear segment which is inclined in relation to the direction of the parallel branches.

8. A method as claimed in claim 1, wherein at least one inclined deposit (91, 92, 114, 115) is formed of two rectilinear segments, one (92, 115) of which is perpendicular to the direction of the parallel branches.

9. A method as claimed in claim 1, wherein depositing and breaking operations are carried out using at least one focused ion beam (FIB) facility.

10. An integrated circuit comprising branches, called parallel branches (1, 2, 1', 2', 21 to 24, 71 to 74, 101 to 105), which are parallel to each other and belong to tracks of conductive material, of which at least one, called the deflected branch, has at least one bend (3, 3', 25, 45, 75, 77, 106, 116, 133, 137, 140) where it is deflected by a right angle in relation to the parallel branches of a minimal group of parallel branches, being prolonged by a branch, called the perpendicular branch, which is perpendicular to this deflected branch, the right-angled bend being formed between this deflected branch and this perpendicular branch, the deflected branch and the perpendicular branch belonging to the same layer of material of the integrated circuit, wherein it comprises, at least adjacent to at least one bend of a deflected branch:

rectilinear deposit, called the perpendicular deposit (5, 5', 27, 47, 80, 107, 117, 130, 134, 141), of conductive material, perpendicular to the parallel branches between the deflected branch which is immediately adjacent to the bend, and a parallel branch which is thus connected to the deflected branch, a deposit, called the inclined deposit (9, 9', 39, 60, 84, 91, 92, 111, 114, 115, 131, 136, 143), of conductive material between a point, called the first connection point, of the perpendicular branch and a point, called the second connection point, of a parallel branch which is thus connected to this perpendicular branch, this inclined deposit passing above at least the deflected branch, and being insulated from it, and from any other intermediate track above which this inclined deposit must pass between the connection points, by a layer of insulating material, a break (8, 8', 30, 62, 83, 122) of the perpendicular branch between the said first connection point and the bend, a break (7, 7', 38, 59, 82) immediately adjacent to the second connection point on a portion of the parallel branch including this second connection point, adjacent to the inclined deposit, and forming an acute angle with the straight direction passing through the connection points of this inclined deposit, in such a way that the inputs/outputs of the tracks which comprise these parallel branches have been subjected to a swap, by means of these deposits and breaks, in relation to the outputs/inputs of the said tracks.

11. A circuit according to claim 10, wherein the deposits (5, 5', 27, 47, 80, 107, 117, 130, 134, 141, 9, 9', 39, 60, 84, 91, 92, 111, 114, 115, 131, 136, 143) are formed above an upper insulating circuit layer, and are connected to the branches by connecting holes which pass through at least this upper insulating layer.

12. A circuit according to claim 10, wherein the parallel branches (1, 2, 1', 2', 21 to 24, 71 to 74, 101 to 105) belong to the same layer of conductive material of the integrated circuit, the deflected branch is the furthest out in this layer in relation to the parallel branches of the minimal group, and is deflected by a right angle towards the outside of these parallel branches, the perpendicular branch extending within this layer from the bend to the outside of the parallel branches of the minimal group.

13. A circuit according to claim 10, wherein at least one inclined deposit (9, 9', 39, 60, 84, 111, 131, 136, 143) is formed of a single rectilinear segment which is inclined in relation to the direction of the parallel branches.

14. A circuit according to claim 10, wherein at least one inclined deposit (91, 92, 114, 115) is formed of two rectilinear segments, one (92, 115) of which is perpendicular to the direction of the parallel branches.

* * * * *